United States Patent [19]

Cloutier et al.

[11] Patent Number: 4,675,664

[45] Date of Patent: Jun. 23, 1987

[54] ALARM SYSTEM AND METHOD FOR DETECTING PROXIMITY OF AN OBJECT TO ELECTRICAL POWER LINES

[75] Inventors: Marius Cloutier, Boucherville; Jean-Marc Bourgeois, Longueuil; Francois Lalonde, Varennes, all of Canada

[73] Assignee: Hydro-Quebec, Quebec, Canada

[21] Appl. No.: 848,467

[22] Filed: Apr. 7, 1986

Related U.S. Application Data

[63] Continuation-in-part of Ser. No. 545,499, Oct. 26, 1983, abandoned.

[51] Int. Cl.⁴ .................................. G08B 21/00
[52] U.S. Cl. ............................ 340/685; 212/151; 340/534; 340/661
[58] Field of Search ............... 340/685, 662, 661, 664, 340/534; 212/151

[56] References Cited

U.S. PATENT DOCUMENTS 3,168,729  2/1965  Volberg ............................ 340/685
4,330,777  5/1982  McDuff ............................ 340/661

Primary Examiner—Glen R. Swann, III
Attorney, Agent, or Firm—Oblon, Fisher, Spivak, McClelland & Maier

[57] ABSTRACT

An antenna receives, by capacitive effect, a current of which the intensity is a function of the distance separating the antenna from an electrical power line. The other factors that influence the current are fixed, constant or are considered negligible. A measuring and conditioning circuit converts the current at the output of the antenna into a coded signal and transmits this coded signal to a control unit. The control unit compares the coded signal to predetermined values stored therein. Alarms are generated by the control unit when the current from the antenna exceeds the predetermined values.

9 Claims, 12 Drawing Figures

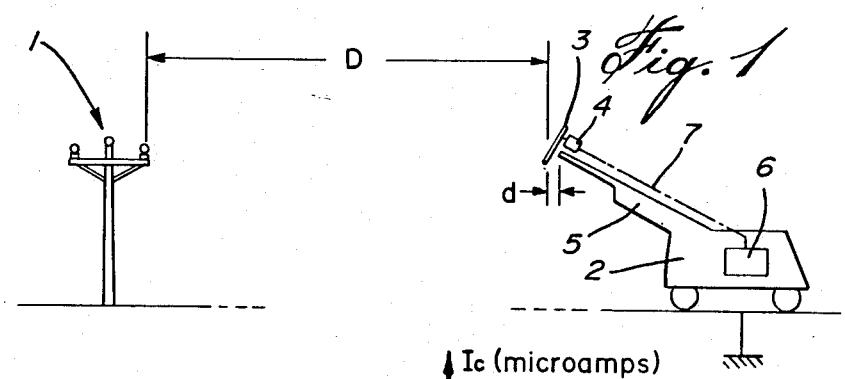
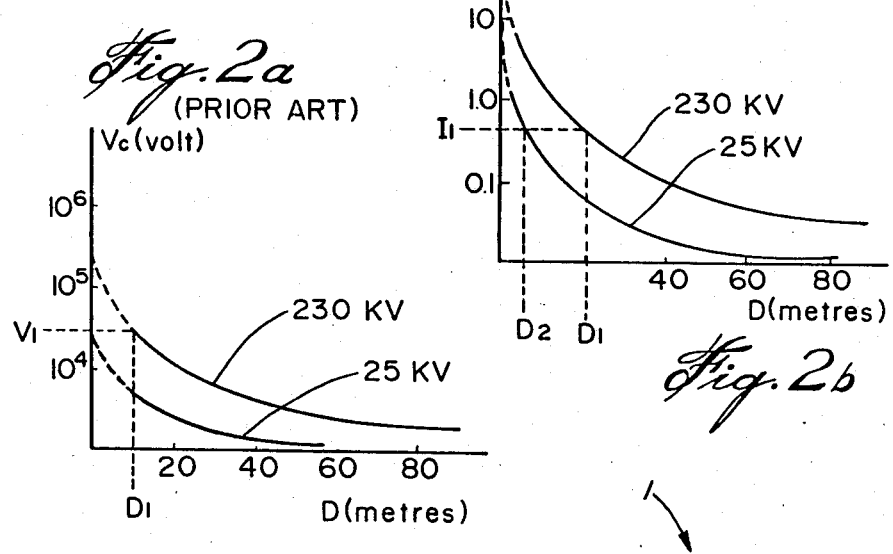
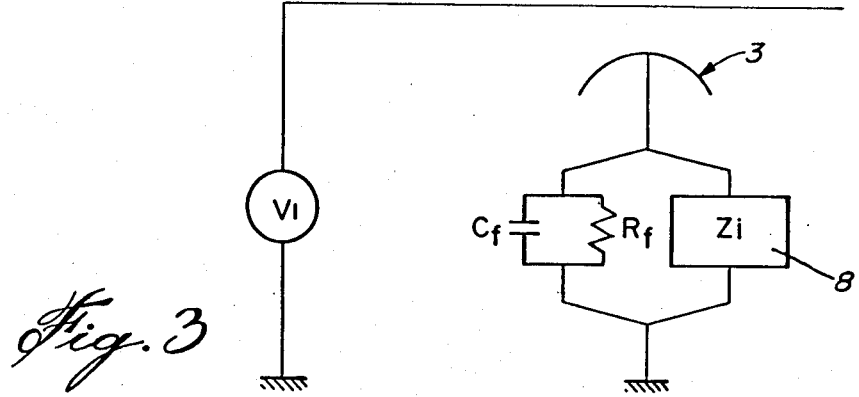

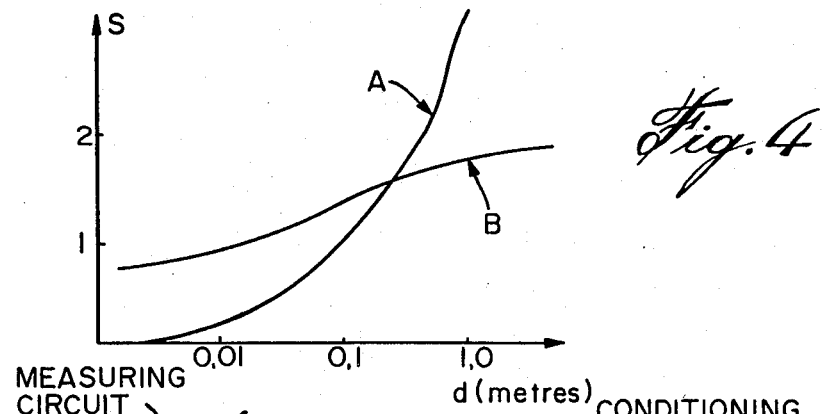
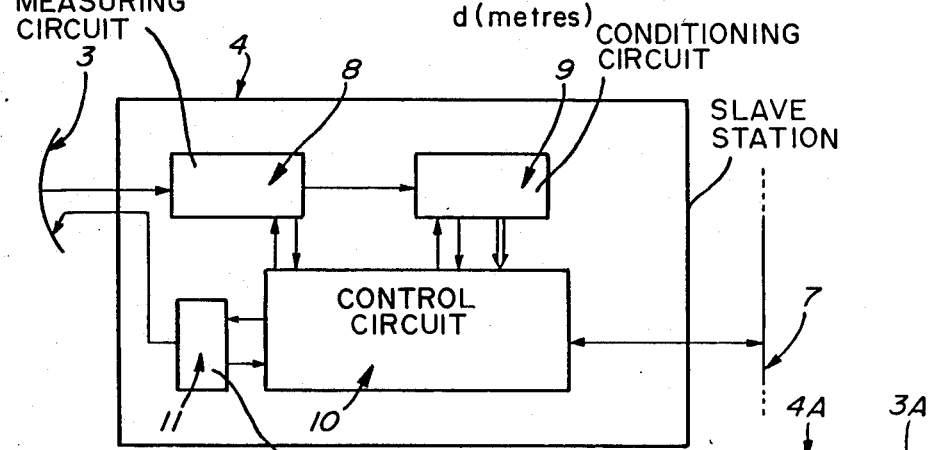
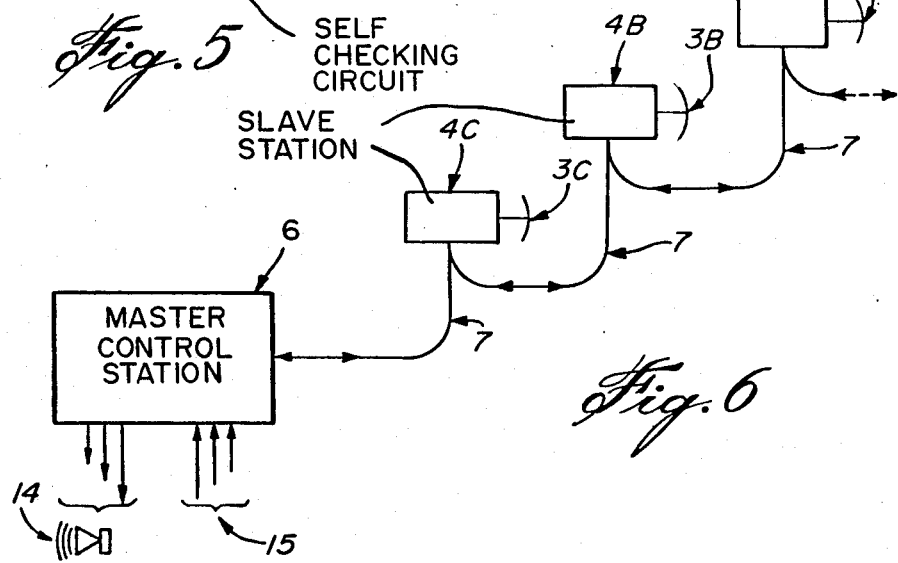

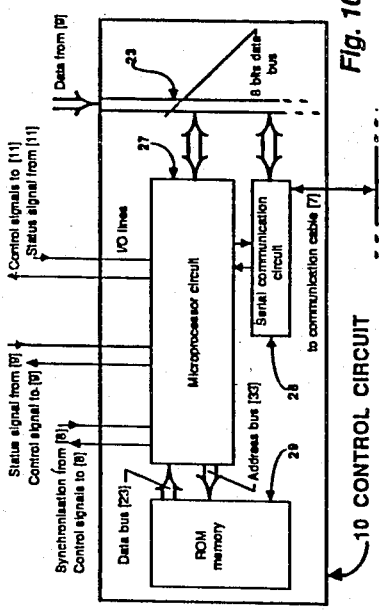
Fig. 10 CONTROL CIRCUIT
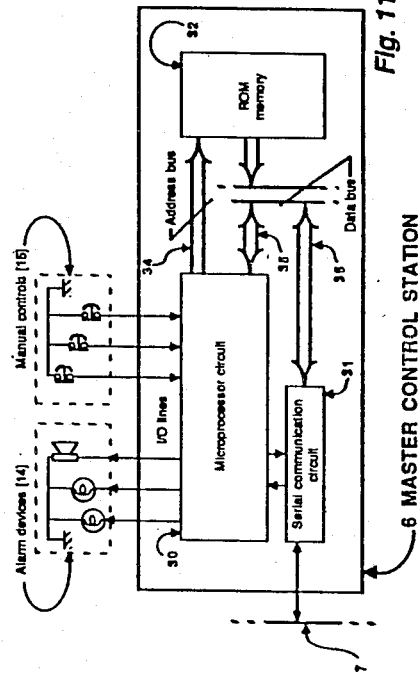
Fig. 11 MASTER CONTROL STATION
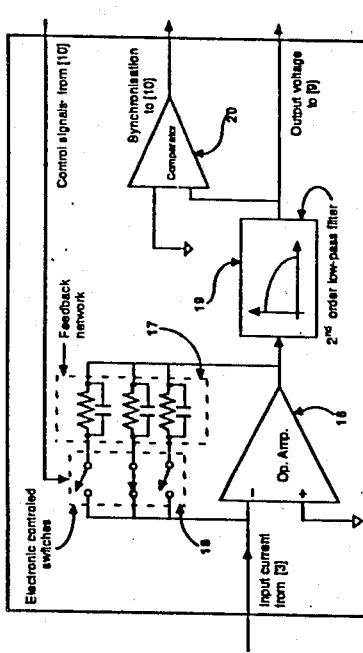
Fig. 7 MEASURING CIRCUIT
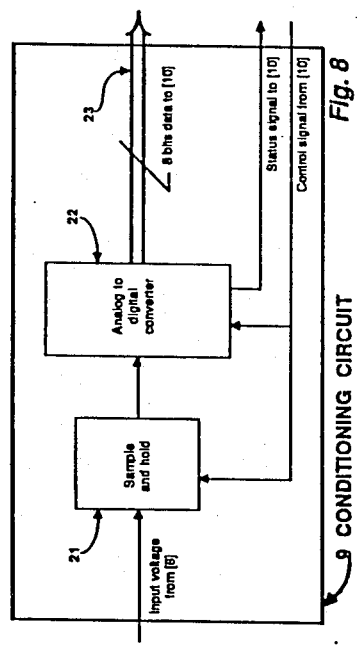
Fig. 8 CONDITIONING CIRCUIT
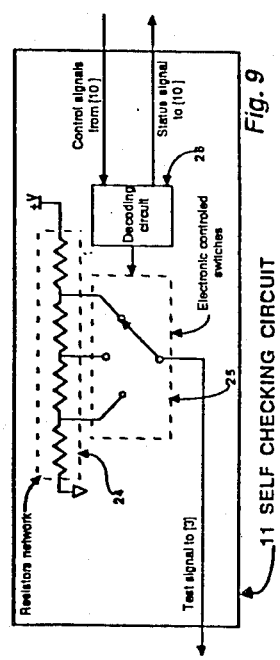
Fig. 9 SELF CHECKING CIRCUIT

ALARM SYSTEM AND METHOD FOR DETECTING PROXIMITY OF AN OBJECT TO ELECTRICAL POWER LINES

CROSS-REFERENCE TO RELATED APPLICATION

This application is a continuation-in-part of parent application Ser. No. 545,499, filed Oct. 26, 1983, abandoned.

BACKGROUND OF INVENTION

1. Field of the Invention

The present invention is concerned with the detection of the proximity of an object to one or more high voltage power lines and more particularly relates to a system and a method to detect proximity to high power alternating current electrical lines. The invention provides a means of signalling to the operator of heavy equipment in the environment of such lines of the danger of a portion of the equipment being too close to such high voltage electrical lines.

2. Description of Prior Art

Each year, an increasing number of workers are subjected to injuries, resulting in physical and psychological damage, from electrical shocks when an equipment that a person is operating or standing close to comes in contact with or too close to a high power electrical line. Such is often the case when a crane or a vehicle having a boom is operating near such lines. In order to try to reduce this danger, various proximity detection systems or devices have been developed and used. Such systems or devices utilize circuits which operate on the principle of the measurement of equipotential voltages. It is known that an electrical field builds up about electrical power lines and the intensity of such field decreases along equipotential lines. The voltage of the field is measured and increases as the measuring device is displaced closer and closer to the electrical power line, the maximum intensity of the voltage being achieved when the measuring antenna touches the line. In the detection circuits heretofore known, the equipotential voltage which is received by the antenna is measured and compared to a known value and all measured voltages that are greater than the known value cause an alarm to be activated.

One of the major disadvantages of such systems is that the voltage which is received by the antenna leans toward a limit value which is the line to ground voltage. Thus, in the presence of two electrical lines of different voltages, there is a risk of touching the line at the lowest voltage without activating the alarm. It is conceivable that the level of the voltage required to trigger the alarm of one of the lines, having the higher voltage, can be higher to the actual voltage on the other line. Also, it is pointed out that equipotential voltages are easily disturbed by neighboring metallic structures (i.e., steel towers). To all these inconveniences, there is also the difficulty of measuring equipotential voltages due to the requirement of very high impedance circuits.

SUMMARY OF INVENTION

It is a feature of the present invention to substantially overcome these inconveniences in the prior art and the present invention therefore provides a method and a system for detecting the proximity of an object to electrical AC power lines by measuring the capacitive current generated from a live electrical power line. For a given line, at a given voltage, the intensity of the capacitive current is a function of the distance between the receiving antenna device and the electrical power line. With such an arrangement we can therefore utilize the information to evaluate the distance between the line and the receiving antenna device.

The method of detection of the present invention provides an important improvement with respect to the method of measuring equipotential voltages for the reason that the intensity of the capacitive current increases rapidly as the distance between the receiving antenna device and the electrical line diminishes, and becomes theoretically infinite as the distance becomes null. By the method of the present invention, the threshold value indicating the value above which the danger of contacting the line exists, is always obtained regardless of the voltage on the electrical line. Furthermore, the principle of measuring the capacitive current considerably reduces the effects on the received signal caused by environmental structures. Finally, the circuits utilized with the present invention to measure the capacitive current do not require high impedance circuits.

According to another broad aspect, the present invention provides a system for detecting the proximity of an object to electrical power lines carrying an AC voltage and creating a resulting electrical field. The system comprises a receiving antenna device capable of receiving, by capacitive effect, a current of which the intensity is primarily a function of the distance between the receiver antenna device and the electrical line. The system further comprises a measuring and conditioning circuit which converts this current into a coded signal. Alarm means are activated by the measuring and conditioning circuit to generate an alarm when the coded signal reaches predetermined stored values.

According to a further broad aspect, the present invention provides a method of detecting the proximity of an object to an electrical power line having an alternating voltage and creating a resulting electrical field. The method comprises the steps of receiving by capacitive effect a current of which the intensity is a function of the distance between a receiver antenna device and an electrical power line. Thereafter, the intensity of the current received is measured in a measuring and conditioning circuit. This measured value is conditioned and coded in the same measuring and conditioning circuit in order to transmit a coded signal towards a control unit to compare such coded signal to predetermine stored coded signal values. If the coded signal exceeds the predetermined coded values stored in the master control station memory, an alarm is then triggered.

BRIEF DESCRIPTION OF DRAWINGS

An example of the preferred embodiment of the present invention will now be described with reference to the accompanying drawings in which:

FIG. 1 is a schematic illustration of a crane equipped with the proximity detector of the present invention in the vicinity of a power line;

FIG. 2A is a graph diagram illustrating the signal curve of the prior art method of equipotential measurement as a function of the distance separating the receiver antenna device from the electrical power line;

FIG. 2B is a graph showing the signal curve when measuring capacitive current as a function of the distance separating the receiver antenna device from the electrical power line;

FIG. 3 is a schematic illustration showing the impedances of a metal dish utilized as a sensing device for measuring equipotential voltages and capacitive currents;

FIG. 4 is a graph showing the curves of measured signals as a function of the distance d (FIG. 1) between the receiver antenna device and the metallics boom for both equipotential measurement and capacitive current measurement;

FIG. 5 is a block diagram of the measuring and conditioning circuit also herein known as a slave station;

FIG. 6 is a block diagram of a typical installation of the detection system of the present invention;

FIG. 7 is a block diagram of the measuring circuit;

FIG. 8 is a block diagram of the conditioning circuit;

FIG. 9 is a block diagram of the self-checking circuit;

FIG. 10 is a block diagram of the slave microprocessor circuit also herein known as the control circuit; and FIG. 11 is a block diagram of the master control station.

DESCRIPTION OF PREFERRED EMBODIMENTS

Referring now to FIG. 1, there is illustrated very schematically the method of detecting the proximity to an electrical line 1 by capacitive current measurement. A crane 2 is positioned close to the electrical line 1 and is provided at the extremity of the boom 5 with a receiver antenna device 3 which is located a distance D from the electrical conductive power line 1 and at a distance d from the metallic boom 5. At a certain distance D from the electrical line 1, the voltage flowing in the line induces in the receiver antenna device 3 a current of which the magnitude is measured by the use of the measuring and conditioning circuit in the slave station 4 which is located close to the receiving device 3. A master control station 6 is connected to the slave station 4 by a cable 7. This master control station 6 is also connected to alarm circuits (not shown) in order to provide an alarm to the operator when a danger situation exists and is further provided with a self-checking circuit to verify the proper operation of the slave station.

The combination of the electrical line and the receiver antenna device 3 forms a capacitor C. This capacitor has a capacitance which is expressed by the following formula:

$$C = G'(D, d, s, \epsilon_r, T_1, T_2)$$

where G' is a sign definition of function, D is the distance between the electrical line 1 and the receiver antenna device 3, d is the distance between the receiver antenna device 3 and the metalic boom 5, s is the surface of the sensing device 3; $\epsilon_r$ is the dielectric constant; $T_1$ is the effect from the line geometry; $T_2$ is the effect from the metallic structural geometry around the sensing device. In the present detection system, some of these parameters are fixed, others are voluntarily fixed, and some are negligible or made negligible by the measuring method utilized. The only significant parameter is thus the distance between the receiver antenna device 3 and the line 1, namely the distance D. Thus, we can simplify the formula as follows:

$$C = G(D)$$

where G is a sign definition of function, and D is the distance between the electrical line and the receiver antenna.

This relation permits us to deduce that the current which is received in the receiver antenna device has an intensity $I_c$ which is a function of the distance D separating the receiver antenna device 3 from the line 1 and of the voltage V of the line. This can be expressed by the following equation:

$$I_c = (2\pi f V) C,$$

$$C = G(D)$$

where C is the capacitance between the line and the receiver antenna device; D is the distance between the line and the receiver antenna device; $I_c$ is the capacitive current; f is the frequency of the voltage V of the electrical line.

The capacitive current measuring system of the present invention offers considerable advantages when compared to the prior art systems which are based on measuring equipotential voltages. FIG. 2A is a graph illustration of measurements of equipotential voltage as a function of the distance between the receiver antenna device and the electrical line. This graph illustrates the signal voltage $V_c$ when the receiver antenna device is in the neighborhood of a 230 kV electrical line or in the neighborhood of a 25 kV electrical line. It can be seen that when a reference voltage has been established at a value of $V_1$ to trigger an alarm in order to limit the distance of the equipment to a value $D_1$ from the line, this reference voltage can be inoperative when utilized in proximity to a 25 kV line as the reference voltage $V_1$ is at a level which is above the voltage of a 25 kV line. This creates a very dangerous situation as the equipment can touch the 25 kV line without an alarm having been triggered.

By measuring the capacitive current as with the present invention, such a danger situation is eliminated. FIG. 2B illustrates the capacitive current $I_c$ of which the intensity is a function of the distance between the receiver antenna device and the electrical line and of the voltage of that line. This Figure illustrates the distribution of the intensity of the signal $I_c$ with respect to two particular electrical lines, namely a 230 kV and a 25 kV electrical lines. In this example, it can be seen that even if the reference point to trigger the alarm is fixed at a value $I_1$, in order to limit the boom of a vehicle within a distance $D_{16}$ in the case of a 230 kV line, there will also be an alarm triggered within the displacement $D_2$ in the environment of a 25 kV line even if the reference point has not been corrected for the operation in the environment of a 25 kV line. Thus, an alarm will be triggered even if the distance $D_2$ is less than the required distance permissible with respect to a 25 kV line.

An important feature of the present invention is that the capacitive current $I_c$ tends towards a theoretical infinite value and not a fixed value as is the case when measuring equipotential voltages. Accordingly, by measuring the capacitive current it is possible to improve means of detecting proximity to electrical lines.

The principle of the present invention wherein proximity to a line is determined by measuring the capacitive current, offers other important advantages when we consider the construction of the measuring and conditioning circuit utilized in the system. An important feature associated with this method resides in the value of the input impedance of the measuring circuit in the slave station. When measuring equipotential voltages, as is also the case with measuring voltages, a high impedance input circuit is required with respect to the source impedance. In the case of measuring equipotential voltages, the source impedance seen by the measuring system is very large, many hundreds of megohms. It is therefore extremely difficult to design a measuring system which is adequate to obtain such measurements. On the other hand, the measure of the capacitive currents necessitate the use of a very low input impedance circuit with respect to the source impedance and this is very advantageous.

FIG. 3 is an illustration to demonstrate another advantage in measuring the capacitive current at a receiver antenna device. FIG. 3 illustrates the electrical model of the effects caused by the presence of metallic structures on the signal present at the receiver antenna device 3, herein a metallic dish antenna. In order to obtain a reliable measure of the signal, to represent the distance between the receiver antenna 3 and the line 1, it is necessary to minimize capacitive and resistive leakages $C_F$ and $R_F$ which drain the signal towards ground via the metallic structures in the environment of the antenna 3. When measuring equipotential voltages, the input impedance $Z_i$ of a measuring circuit 8 is very high and the leakage will considerably affect the measurement, which measurement is thus unnacceptable when there is a metallic structure in the environment of the receiving antenna. Knowing that the leakage capacity $C_F$ is a variable term which depends mainly on the position of the antenna with respect to the metallic structure, the measured equipotential voltage is highly dependent on the distance separating the receiver antenna from the metallic structure (i.e., the boom of a crane). However, when measuring capacitive currents, the input impedance $Z_i$ of the measuring circuit 8 is very low and the leakage to the metallic structure (such as a boom) is considerably reduced and thus does not measurably affect the measurement, rendering it more reliable.

FIG. 4 illustrates clearly the reliability of the measuring signal when using the method of the present invention as compared with the method of the prior art where equipotential voltages are measured. The curve B illustrates the measuring signal when using the capacitive current method whereas the curve A illustrates the measuring signal when utilizing the equipotential voltage measuring method. It can be seen that the measurements of curve B are less disturbed by the presence of metallic structures. Another advantage of using this signal is therefore that the receiving antenna can be located closer to the metallic boom or metallic structure of a vehicle thus causing less inconvenience.

In the present invention, the input signal is processed in two different steps. Firstly, the capacitive current received by the antenna 3 is subjected to a series of conversions in a measuring and conditioning circuit 4 which is located close to the antenna 3 (see FIG. 5). The final processing stage of the signal as well as the alarm triggering circuit are located in a master control station 6, as illustrated in FIG. 6. This master control station is accessible to the operator of the vehicle and he is provided with controls such as at 15, to operate the system.

Referring to FIG. 5, the slave station 4 is shown connected to the antenna 3 which receives the capacitive currents and is also connected to the master control station 6 via connecting cable 7. The slave station 4 has a current measuring circuit 8. The signal at the output of the circuit 8 is fed to a conditioning circuit 9 in order to obtain a measured signal via control circuit 10 and to convert the measured signal into a coded signal to be transmitted to the master control station 6. The control circuit 10 is provided with a microprocessor and associated connecting circuits, and controls the operation of the slave station 4 including the transmission of signals through cable 7. A shelf-checking circuit 11 works in conjunction with the control circuit 10 to assure the proper functioning of the sub-circuits of the slave station 4 as well as the proper operation of the antenna 3. It is pointed out that the circuits 8, 9, 10 and 11 may be of a variety of designs obvious to a person skilled in the art.

FIG. 6 is a schematic block diagram illustrating a typical installation of a measuring system. As herein shown, a plurality of slave stations 4, herein 4A, 4B, 4C, are each provided with a receiver antenna 3A, 3B, 3C, respectively, interconnected by a cable 7. These slave stations 4A, 4B, and 4C are connected along a boom or at various strategic locations of a heavy machine, such as a crane.

The detection system as illustrated in FIGS. 5 and 6 assists the operator of the vehicle in providing an aid for proximity evaluation of the vehicle to electrical lines.

The slave stations provide the measuring of the capacitive currents as well as the conditioning of the measured signals to make it reliable for the master control station. The first stage of the sub-circuits in the slave station measures the capacitive current over a dynamic range of approximately 100 dB. This operation is effected by the automatic gain controlled current-voltage converter circuit 8. The converter 8 is operated by the control and command circuit 10 and is capable of measuring signals on a large dynamic range with the precision required for the system. In order to eliminate the effects of noise, the slave station contains filter circuits (not shown). Noise rejection is effected in three steps. Firstly, a filter is provided to filter the analog signals and is incorporated in the measuring circuit 8. Secondly, digital filters are provided in the control circuit 10. Thirdly, the conditioning circuit 9 and the control circuit 10 are synchronized to the frequency of the electrical line voltage. This synchronization helps to eliminate noise which are not synchronous to the line frequency. The self-checking circuit continuously verifies the operation of the slave stations and provides the operator with a signal when there is a defective condition in the circuit. In the case, as shown in FIG. 5, this verification by the circuit 11 is effected from the antenna input 3 to the output cable 7. The verification of the antenna is effected by polarizing the antenna with a signal which is located outside the frequency band of the signals being measured, and this being done by the self-checking circuit 11. This way, a short circuit or an open circuit condition on the antenna is immediately detected. This signal also makes it possible to continuously check the working conditions of the rest of the system as the system must recognize the continuing presence of the verification signal. The malfunction of the control circuit 10 is detected by the master control station 6.

At the master control station 6, the circuits therein are provided for the verification of the validity of the signals being transmitted by the slave stations. The master control station also effects the required signal manipulation and calculations in order to trigger the alarms, such as 14, when required. The master control station 6 consists primarily of a microprocessor and associated circuits. The signal on the input line 7 is, as previously described, a coded message containing information as to the functioning of the slave station as well as the measured signal corresponding to the capacitive current measured. The master control station can therefore make decisions as to the proper functioning of the slave stations, such as 4A to 4C, by analyzing the first part of the message containing the coded signal. If the functioning of the slave stations is good, the master control station will then utilize the second part of the message in order to evaluate proximity conditions of the crane as related to the electrical lines, and trigger and alarm 14, if necessary. If the operation of the slave stations is judged to be improper by the nature of the first part of the composite signal, the operator of the vehicle is notified by providing a particular indication on a control panel (not shown). The master control station can also command the slave stations in order to initiate verifications of the circuits or adjustments thereof, or any other necessary function.

Finally, in order to assure the reliability of the system, the master control station is also provided with a verification system (not shown).

Each time an equipment is utilized with the system of the present invention, the operator must firstly execute a simple procedure to set the system via manual controls at 15. Using the controls 15, the operator initiates memorization of reference capacitive current values. Those values are used to trigger alarms and to provide progressive relative indication of the proximity to electrical lines.

A block diagram of the measuring circuit is illustrated in FIG. 7. The measuring circuit includes an operational amplifier 16 having a feedback network between the output and the non-inverting input thereof. The feedback network comprises a plurality of elements, and the selection of these elements is performed by electronic switches 18 which is controlled by signals from the control circuit 10.

As seen in FIG. 7, the capacitive current received by the antenna 3 is fed into the inverting input of the operational amplifier 16. In view of the feedback network of the operational amplifier, and in view of the fact that the non-inverting input of the operational amplifier is referred to the common, the configuration acts as a current to voltage converter. The output voltage of amplifier 16 is an image of the current in the antenna 3. The overall gain of this converter is controlled by the value of the feedback network. The electronic switches 18, actuated by the control circuit 10, can select one of the elements of the feedback network. Thus, the gain of this current to voltage converter is controlled by the control circuit 10 through the actions on these switches 18.

The output voltage of amplifier 16 is then fed into a second order low-pass filter 19 to eliminate the excess of noise and unwanted signals coupled to antenna 3. The filtered voltage is then fed to the input of conditioning circuit 9 and also to the input of a signal comparator 20. This comparator circuit 20 generates a square wave at the same frequency and phase as the signal voltage and feeds the control circuit 10 with this signal which is a synchronization signal.

The conditioning circuit 9, as illustrated in FIG. 8, comprises a sample and hold circuit 21 and an analog to digital converter 22.

As seen in FIG. 8, the input voltage from the measurement circuit 8 is fed into the sample and hold circuit 21. On a control signal from the control circuit 10, the time varying signal at the input of 21 is sampled and held. The output of circuit 21 is the value of the input signal at the instant of sample and hold action.

This time stable value of voltage is fed to the input of the analog to digital converter 22. Started by the control circuit 10, the converter 22 transforms the analog input into a coded 8 bit data words. A status signal from the converter 22 is fed to the control circuit 10 to enable the transfer of valid data and restart the conditioning circuit 9 for another cycle.

The self-checking circuit 11, illustrated in FIG. 9, comprises a resistor network 24, having an electronic switch 25 for selecting a portion of the network. The electronic switch 25 is controlled by the output of a decoding circuit 26. The resistor network 24 is connected between a stable reference voltage and the common to form a multiple output voltage divider. The electronic switch 25 actuated by decoding circuit 26, selects a tapping point in the resistor network 24. The different voltage levels form the test signals fed to the antenna 3. A status signal is fed to the control circuit 10 to indicate the position of the switch.

The control circuit 10, illustrated in FIG. 10, comprises a microprocessor circuit 27 with an associated ROM memory 29. The microprocessor is connected to a serial communication circuit 28. The microprocessor circuit 27 generates control signals for the operation of the measuring circuit 8, the conditioning circuit 9, the self-checking circuit 11 and the serial communication circuit 28. The information on all the operations to be done are stored in the ROM memory 29. The microprocessor 27 addresses the memory 29 by signals on the address bus 33. the memory 29 outputs the stored information into the microprocessor on the data bus 23. With this pattern of action and with the status signals, synchronization signal and data values, the microprocessor circuit acquires valid data on the magnitude of the capacitive current at antenna 3 and on the status of all the elements of the slave station 4.

Signals from cable 7 are fed into the serial communication circuit 28. A decoded message from the circuit 28 is transferred to the microprocessor 27 on the data bus 23. The message is interpreted by the microprocessor 27 and the valid data on capacitive current and slave station status are fed to the communication circuit 28. The serial communication circuit 28 encodes the data and status message to produce signals fed to the cable 7.

A master control station 6, illustrated in FIG. 11, also includes a microprocessor 30 with an associated ROM memory 32. The master control station 6 also includes a serial communication circuit 31.

The microprocessor outputs driving signals to alarm devices 14 and receives inputs from manual controls 15.

The microprocessor circuit 30 generates control signals for the operation of the alarm devices 14 and the serial communication circuit 31. The information on all the operations to be done are stored in the ROM memory 32. The microprocessor 30 addresses the memory 32 by signals on the address bus 34. The memory 32 outputs the stored information to the microprocessor on the data bus 35. With this pattern of action and with messages from the communication circuit 31 and the status of the manual controls 15, the microprocessor 30 produces control signals to enable the operation of the alarm devices 14.

It is within the ambit of the present invention to cover any obvious modifications of the example of the preferred embodiments described herein, provided such modifications fall within the scope of the appended claims.

We claim:

1. A system for detecting the proximity of an object to an alternating current power electrical line which creates a resulting electric field, said system comprising a receiver antenna device capable of receiving a current by capacitive effect and wherein the intensity of the current is a function of the distance separating the receiver antenna device from the said electrical line; a measuring and conditioning circuit for converting the said received current to a coded signal, said measuring and conditioning circuit having a low input impedance with relation to a source impedance, whereby the influence of leakage through a supporting structure of the said receiver antenna is considerably reduced; and alarm means associated with said measuring and conditioning circuit to generate an alarm signal when the said coded signal reaches predetermined stored values.

2. A detection system according to claim 1 wherein said measuring and conditioning circuit has an automatic gain controlled current-voltage converter and conditioning and control circuits for transforming the said received current into said coded signal for transmission to a master control station which is provided with said alarm means.

3. A detection system according to claim 2 wherein said predetermined stored values are determined on request by the operator each time an equipment, provided with said system, is located in a new environment of electrical lines.

4. A detection system as claimed in claim 2 wherein there is a plurality of slave stations, each slave station having one of said receiving antenna devices to receive by the capacitive effect a current of which the intensity is a function of the distance separating the said receiver antenna device from an electrical line, and wherein a master control station is connected to each of said slave stations by means of a connecting cable and wherein said master control station is provided with alarm means to trigger an alarm when commanded by said master control station.

5. A detection system as claimed in claim 4 wherein each said slave station is provided with a self-checking circuit which provides a continuous verification signal situated outside the frequency band of the signal measured by the receiver device and verified by the said master control station.

6. A method of detecting the proximity of an object to an electrical line having an alternating voltage creating a resulting electrical field, said method comprising the steps of receiving by capacitive effect a current of which the intensity is a function of the ditance separating a receiver antenna device from the said electrical line; measuring the intensity of the said received current by a measuring and conditioning circuit having a low impedance as compared to a source impedance whereby the influence of leakage through a supporting structure of said receiver antenna is considerably reduced; conditioning said received current to provide a coded signal for transmission to a master control station; analyzing said coded signal in said master control station whereby to compare said signal to predetermined stored values; and triggering alarm means if the coded signal contains information requiring an alarm to be triggered.

7. A method as claimed in claim 6 wherein the operation of the system is continuously verified by means of a verification signal injected into the system, said verification signal being located outside the frequency band of the signal to be measured by the receiver antenna device.

8. A method as claimed in claim 7 wherein a plurality of different signals are measured by means of a plurality of receiver antenna devices and measuring and conditioning circuits to provide a plurality of coded signals to be fed to said master control station.

9. A method as claimed in claim 7 wherein said master control station analyzes the coded signals whereby to determine the proper functioning of the system.

* * * * *